(12) United States Patent
Li et al.

(10) Patent No.: US 11,563,073 B2
(45) Date of Patent: Jan. 24, 2023

(54) ARRAY SUBSTRATE AND MANUFACTURING METHOD THEREOF, DISPLAY PANEL, DISPLAY DEVICE AND PIXEL DRIVING CIRCUIT

(71) Applicants: BOE Technology Group Co., Ltd., Beijing (CN); Chengdu BOE Optoelectronics Technology Co., Ltd., Chengdu (CN)

(72) Inventors: Meng Li, Beijing (CN); Sen Du, Beijing (CN); Tianyi Cheng, Beijing (CN); Tiaomei Zhang, Beijing (CN); Yao Huang, Beijing (CN); Tingliang Liu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 191 days.

(21) Appl. No.: 17/040,587

(22) PCT Filed: Mar. 20, 2020

(86) PCT No.: PCT/CN2020/080429
§ 371 (c)(1),
(2) Date: Sep. 23, 2020

(87) PCT Pub. No.: WO2020/192585
PCT Pub. Date: Oct. 1, 2020

(65) Prior Publication Data
US 2021/0233989 A1    Jul. 29, 2021

(30) Foreign Application Priority Data

Mar. 28, 2019    (CN) .......................... 201910244901.8

(51) Int. Cl.
*H01L 27/32*  (2006.01)
*G09G 3/3258*  (2016.01)

(52) U.S. Cl.
CPC ....... *H01L 27/3276* (2013.01); *G09G 3/3258* (2013.01); *H01L 2227/323* (2013.01)

(58) Field of Classification Search
CPC .. H01L 27/3276; H01L 27/32; H01L 27/3272
See application file for complete search history.

(56) References Cited

U.S. PATENT DOCUMENTS

| 9,035,854 B2 | 5/2015 | Lee et al. |
| 9,673,266 B2 | 6/2017 | Zhang |

(Continued)

FOREIGN PATENT DOCUMENTS

| CN | 102456707 A | 5/2012 |
| CN | 102569675 A | 7/2012 |

(Continued)

OTHER PUBLICATIONS

First Office Action, including search report, for Chinese Patent Application No. 201910244901.8, dated Jun. 15, 2020, 13 pages.

(Continued)

*Primary Examiner* — Sardis F Azongha
(74) *Attorney, Agent, or Firm* — Westman, Champlin & Koehler, P.A.

(57) ABSTRACT

Disclosed are an array substrate and a manufacturing method thereof, a display panel, a display device and a pixel driving circuit. The array substrate includes: a base substrate; and a wiring layer and an effective light-emitting layer formed and stacked on the base substrate sequentially, wherein the wiring layer includes a first wiring and a second wiring, an orthographic projection of the first wiring on the base substrate overlaps an orthographic projection of the effective light-emitting layer on the base substrate to form a (Continued)

first overlapping area, an orthographic projection of the second wring on the base substrate overlaps the orthographic projection of the effective light-emitting layer on the base substrate to form a second overlapping area, and the first overlapping area and the second overlapping area are respectively located on both sides of a central line of the orthographic projection of the effective light-emitting layer on the base substrate.

18 Claims, 3 Drawing Sheets

(56) References Cited

U.S. PATENT DOCUMENTS

| | | | |
|---|---|---|---|
| 10,297,199 | B2 | 5/2019 | Cai |
| 10,580,850 | B2 | 3/2020 | Lee et al. |
| 10,591,753 | B2 | 3/2020 | Kim et al. |
| 10,644,091 | B2 | 5/2020 | Liu et al. |
| 2012/0162053 | A1 | 6/2012 | Lee et al. |
| 2014/0048793 | A1 | 2/2014 | Sako et al. |
| 2016/0254333 | A1 | 9/2016 | Zhang |
| 2017/0124953 | A1 | 5/2017 | Shim |
| 2018/0082636 | A1 | 3/2018 | Cai |
| 2018/0158895 | A1 | 6/2018 | Lee et al. |
| 2018/0254304 | A1 | 9/2018 | Hong et al. |
| 2018/0337226 | A1 | 11/2018 | Liu et al. |
| 2018/0342570 | A1 | 11/2018 | Hong et al. |
| 2019/0064552 | A1 | 2/2019 | Kim et al. |
| 2020/0161411 | A1 | 5/2020 | Lee et al. |

FOREIGN PATENT DOCUMENTS

| | | |
|---|---|---|
| CN | 103493121 A | 1/2014 |
| CN | 103943787 A | 7/2014 |
| CN | 105702214 A | 6/2016 |
| CN | 107230452 A | 10/2017 |
| CN | 207116482 U | 3/2018 |
| CN | 108172594 A | 6/2018 |
| CN | 108493226 A | 9/2018 |
| CN | 109427854 A | 3/2019 |
| CN | 109786434 A | 5/2019 |
| EP | 2 447 997 A1 | 5/2012 |
| KR | 10-2007-0041240 A | 4/2007 |

OTHER PUBLICATIONS

Second Office Action, including search report, for Chinese Patent Application No. 201910244901.8, dated Dec. 28, 2020, 14 pages.
Non-Final Rejection for U.S. Appl. No. 16/825,089, notification dated Jul. 7, 2021, 15 pages.

ARRAY SUBSTRATE AND MANUFACTURING METHOD THEREOF, DISPLAY PANEL, DISPLAY DEVICE AND PIXEL DRIVING CIRCUIT

CROSS-REFERENCE TO RELATED APPLICATION

This application is a Section 371 National Stage Application of International Application No. PCT/CN2020/080429, filed on Mar. 20, 2020, entitled "ARRAY SUBSTRATE AND MANUFACTURING METHOD THEREOF, DISPLAY PANEL, DISPLAY DEVICE AND PIXEL DRIVING CIRCUIT" which claims priority to Chinese Application No. 201910244901.8, filed on Mar. 28, 2019, the contents of which are incorporated herein by reference in their entireties.

TECHNICAL FIELD

The present disclosure relates to the field of display technology, and in particular to an array substrate and a manufacturing method thereof, a display panel, a display device and a pixel driving circuit.

BACKGROUND

In recent years, with the progress of display technology, organic light-emitting diode (Organic light-emitting Diode, abbreviated as OLED) displays are one of the hot spots in the field of flat panel display research. More and more active matrix organic light-emitting diodes (Active Matrix Organic light-emitting Diode, abbreviated as AMOLED) display panels have entered the market. Compared with conventional thin film transistor liquid crystal display (abbreviated as TFTLCD), AMOLED has faster response speed, higher contrast and wider viewing angle. With the development of display technology, more and more electronic devices have begun to use bendable and flexible OLED display screens that are thin and have good impact resistance.

SUMMARY

Some embodiments of the present disclosure provide an array substrate, comprising: a base substrate; and a wiring layer and an effective light-emitting layer formed and stacked on the base substrate sequentially, wherein the wiring layer comprises a first wiring and a second wiring, an orthographic projection of the first wiring on the base substrate is overlapped with an orthographic projection of the effective light-emitting layer on the base substrate to form a first overlapping area, an orthographic projection of the second wiring on the base substrate is overlapped with the orthographic projection of the effective light-emitting layer on the base substrate to form a second overlapping area, and the first overlapping area and the second overlapping area are respectively located on both sides of a central line of the orthographic projection of the effective light-emitting layer on the base substrate.

In some embodiments, a distance between the base substrate and a surface of the first wiring facing away from the base substrate is equal to a distance between the base substrate and a surface of the second wiring facing away from the base substrate.

In some embodiments, the orthographic projection of the effective light-emitting layer on the base substrate is in an axisymmetric pattern, and the central line of the orthographic projection of the effective light-emitting layer on the base substrate is a symmetry axis of the axisymmetric pattern.

In some embodiments, the first overlapping area and the second overlapping area are symmetrically arranged with respect to the central line of the orthographic projection of the effective light-emitting layer on the base substrate.

In some embodiments, the first overlapping area and the second overlapping area are both parallel to the central line of the orthographic projection of the effective light-emitting layer on the base substrate.

In some embodiments, the wiring layer further comprises a signal line, wherein a central line of an orthographic projection of the signal line on the base substrate and the central line of the orthographic projection of the effective light-emitting layer on the base substrate are collinear.

In some embodiments, the first wiring, the second wiring and the signal line are arranged in the same layer and employ the same material, and the first wiring, the second wiring and the signal line have the same thickness.

In some embodiments, the first wiring is a high-voltage power wiring, and the signal line is a data signal line.

In some embodiments, the array substrate further comprising: a planarization layer between the wiring layer and the effective light-emitting layer, wherein the planarization layer comprises a first portion and a second portion, an orthographic projection of the first portion on the base substrate coincides with the first overlapping area, an orthographic projection of the second portion on the base substrate coincides with the second overlapping area, and a distance between the base substrate and a surface of the first portion facing away from the base substrate is equal to a distance between the base substrate and a surface of the second portion facing away from the base substrate.

In some embodiments, the array substrate further comprising: a first electrode between the planarization layer and the effective light-emitting layer, wherein the first electrode comprises a third portion and a fourth portion, an orthographic projection of the third portion on the base substrate coincides with the first overlapping area, an orthographic projection of the fourth portion on the base substrate coincides with the second overlapping area, a distance between the base substrate and a surface of the third portion facing away from the base substrate is equal to a distance between the base substrate and a surface of the fourth portion facing away from the base substrate, and the third portion and the fourth portion have the same thickness.

In some embodiments, the effective light-emitting layer comprises a fifth portion and a sixth portion, an orthographic projection of the fifth portion on the base substrate coincides with the first overlapping area, an orthographic projection of the sixth portion on the base substrate coincides with the second overlapping area, a distance between the base substrate and a surface of the fifth portion facing away from the base substrate is equal to a distance between the base substrate and a surface of the sixth portion facing away from the base substrate, and the fifth portion and the sixth portion have the same thickness.

In some embodiments, the fifth portion and the sixth portion are respectively located at two opposite edge regions of the effective light-emitting layer.

In some embodiments, the second wiring is connected to an initialization voltage signal.

In some embodiments, the array substrate further comprising: an interlayer dielectric layer between the base substrate and the wiring layer, wherein the first wiring and the second wiring are formed on a surface of the interlayer dielectric layer facing away from the base substrate.

Some embodiments of the present disclosure provide a display panel comprising the array substrate according to the above embodiments.

Some embodiments of the present disclosure provide a display device comprising the display panel according to the above embodiments Some embodiments of the present disclosure provide a manufacturing method of an array substrate, comprising: providing a base substrate; forming a wiring layer on the base substrate, the wiring layer comprising a first wiring and a second wiring; forming an effective light-emitting layer on the base substrate on which the wiring layer has been formed, wherein an orthographic projection of the first wiring on the base substrate is overlapped with an orthographic projection of the effective light-emitting layer on the base substrate to form a first overlapping area, an orthographic projection of the second wiring on the base substrate is overlapped with the orthographic projection of the effective light-emitting layer on the base substrate to form a second overlapping area, and the first overlapping area and the second overlapping area are respectively located on both sides of a central line of the orthographic projection of the effective light-emitting layer on the base substrate.

In some embodiments, before forming the effective light-emitting layer, the manufacturing method further comprises: forming a planarization layer on the base substrate on which the wiring layer has been formed, wherein the planarization layer comprises a first portion and a second portion, an orthographic projection of the first portion on the base substrate coincides with the first overlapping area, an orthographic projection of the second portion on the base substrate coincides with the second overlapping area, and a distance between the base substrate and a surface of the first portion facing away from the base substrate is equal to a distance between the base substrate and a surface of the second portion facing away from the base substrate.

In some embodiments, before forming the effective light-emitting layer, the manufacturing method further comprises: forming the first electrode on the base substrate on which the planarization layer has been formed, wherein the first electrode comprises a third portion and a fourth portion, an orthographic projection of the third portion on the base substrate coincides with the first overlapping area, an orthographic projection of the fourth portion on the base substrate coincides with the second overlapping area, a distance between the base substrate and a surface of the third portion facing away from the base substrate is equal to a distance between the base substrate and a surface of the fourth portion facing away from the base substrate, and the third portion and the fourth portion have the same thickness.

Some embodiments of the present disclosure provide a pixel driving circuit applied to the array substrate according to the above embodiments, comprising a first thin film transistor, a second thin film transistor, a third thin film transistor, a fourth thin film transistor, a fifth thin film transistor, a sixth thin film transistor, a seventh thin film transistor, a capacitor, and an organic light-emitting diode, wherein a source electrode of the first thin film transistor is connected to an initialization signal, a gate electrode of the first thin film transistor is electrically connected to a reset signal, and a drain electrode of the first thin film transistor is electrically connected to a first node;

a gate electrode of the second thin film transistor is connected to a scan signal, a source electrode of the second thin film transistor is electrically connected to a second node, and a drain electrode of the second thin film transistor is electrically connected to the first node;

a source electrode of the third thin film transistor is electrically connected to the second node, a gate electrode of the third thin film transistor is electrically connected to the first node, and a drain electrode of the third thin film transistor is electrically connected to a third node;

a gate electrode of the fourth thin film transistor is connected to the scan signal, a source electrode of the fourth thin film transistor is electrically connected to a data signal, and a drain electrode of the fourth thin film transistor is electrically connected to the third node;

a source electrode of the fifth thin film transistor is connected to a first power voltage, a gate electrode of the fifth thin film transistor is connected to a light-emitting control signal, and a drain electrode of the fifth thin film transistor is electrically connected to the third node;

a source electrode of the sixth thin film transistor is electrically connected to the second node, a gate electrode of the sixth thin film transistor is connected to a light-emitting control signal, and a drain electrode of the sixth thin film transistor is electrically connected to a fourth node;

a gate electrode of the seventh thin film transistor is connected to the scan signal, a source electrode of the seventh thin film transistor is electrically connected to the initialization signal, and a drain electrode of the seventh thin film transistor is electrically connected to the fourth node;

a first electrode of the organic light-emitting diode is connected to the fourth node, and a second electrode of the organic light-emitting diode is connected to a second power supply voltage;

both ends of the capacitor are electrically connected to the first node and the first power supply voltage, respectively; and the second wiring is floating, or is connected to the initialization signal, or is electrically connected to the first node.

BRIEF DESCRIPTION OF THE DRAWINGS

By reading detailed descriptions of non-limiting embodiments with reference to the following drawings, other features, objectives and advantages of the present disclosure will become more apparent.

DETAILED DESCRIPTION OF EMBODIMENTS

Figure 1:
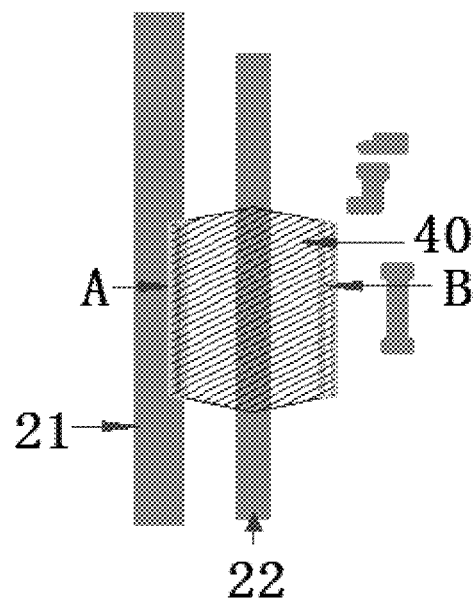
FIG. 1 is a schematic top view of a pixel area in an OLED array substrate in the related art.

The present disclosure will be further described in detail below in conjunction with the drawings and embodiments. It is to be understood that specific embodiments described herein are only used to explain the present disclosure, but not to limit the present disclosure. In addition, it should be noted that, for ease of description, only parts related to the present disclosure are shown in the drawings.

It should be noted that the embodiments in the present disclosure and features in the embodiments may be combined with each other without conflict.

In addition, in the following detailed description, for the convenience of explanation, many specific details are set forth to provide a comprehensive understanding of the embodiments of the present disclosure. However, it is obvious that one or more embodiments may also be implemented without these specific details.

It should be understood that although terms such as first, second, etc. may be used herein to describe different elements, these elements should not be limited by these terms. These terms are only used to distinguish one element from another element. For example, without departing from the scope of exemplary embodiments, the first element may be named as the second element, and similarly, the second element may be named as the first element. A term "and/or" as used herein includes any and all combinations of one or more of the related listed items.

It should be understood that when an element or layer is referred to as being "formed on" another element or layer, the element or layer may be directly or indirectly formed on the other element or layer. That is, for example, there may be an intermediate element or an intermediate layer. In contrast, when an element or layer is referred to as being "directly formed on" another element or layer, there are no intermediate elements or layers. Other terms used to describe a relationship between elements or layers, for example, "between", "directly between", "adjacent", "directly adjacent" or the like, should be interpreted in a similar manner.

The terms used herein are only for the purpose of describing specific embodiments, and are not intended to limit the embodiments. As used herein, unless they are clearly indicated in the context, the singular form is also intended to include the plural form. It is to be understood that when terms "comprising" and/or "comprising" are used herein, it indicates that there are described features, wholes, steps, operations, elements and/or components, but it does not exclude the presence or addition of one or more other features, wholes, steps, operations, elements, components, and/or combinations thereof.

In this context, unless otherwise specified, an expression "thickness" refers to a size of a layer or component in a direction perpendicular to an upper surface of a substrate (in use, the upper surface of the substrate is a surface facing the user).

In this context, unless otherwise specified, an expression "located on the same layer" generally means that a first component and a second component may use the same material and may be formed through the same patterning process.

Conventional display technology uses a single display mode. The brightness, contrast, color gamut and visual color shift (i.e., color difference at different viewing angles) of a liquid crystal display device may change when the liquid crystal display device is viewed, for example, when the user's viewing direction changes from a left side of a screen to a right side of a screen, thereby resulting in reduced visual effects. Especially for some high-quality displays or special display places, such as medical, graphic design and other fields, it is very strict to the visual color shift, and the visual color shift of the conventional display panels has to be improved.

In the OLED display screen, the electroluminescent device is driven by current to emit light. When the user's viewing angle changes, the brightness and contrast of the display screen will also change, thereby resulting in color shift. Therefore, how to improve the color shift of the OLED display area to improve the display effect of the display panel is a problem to be solved urgently.

Figure 2:
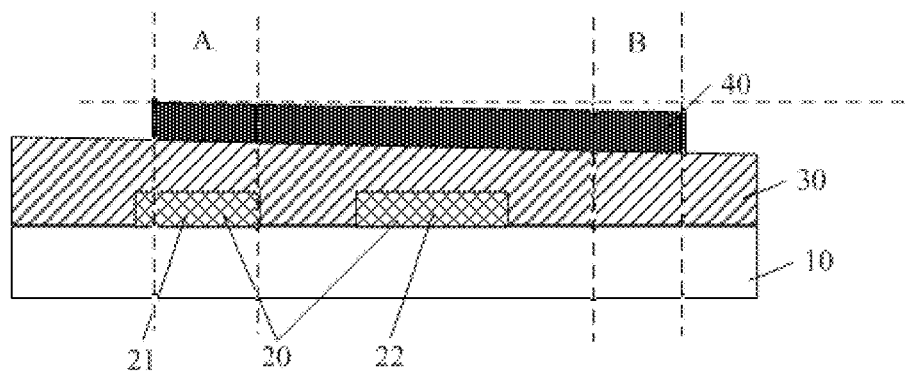
FIG. 2 is a cross-sectional view of the pixel area in the OLED array substrate in FIG. 1.

In the present disclosure, an array substrate is explained by taking an OLED array substrate as an example. The OLED array substrate includes a plurality of pixel areas arranged in an array, each pixel area is provided with an OLED device, and each OLED device includes a first electrode, an effective light-emitting layer and a second electrode which are provided away from a base substrate in sequence. For example, the first electrode is an anode, the effective light-emitting layer is an effective red organic light-emitting layer, an effective green organic light-emitting layer or an effective blue organic light-emitting layer, and the second electrode is a cathode. Those skilled in the art may understand that the array substrate in the present disclosure may also be other electroluminescent array substrates, such as a PLED array substrate. FIG. 1 and FIG. 2 are respectively a top view and a cross-sectional view of a pixel area in an OLED array substrate in the related art, and FIG. 1 mainly shows a wiring layer and the effective light-emitting layer.

In the present disclosure, the effective light-emitting layer refers to a light-emitting functional layer of a single pixel. Generally, the light-emitting functional layer includes a hole injection layer, a hole transport layer, a light-emitting layer, an electron injection layer, and an electron transport layer. In the entire OLED array substrate, the hole injection layers of the light-emitting function layers of all pixels are in an integral structure. In addition to being provided in each pixel area, the hole injection layer is also provided between adjacent pixels, and basically covers the base substrate of the OLED array substrate as a whole. Similarly, the hole transport layers of the light-emitting function layers of all pixels are in an integral structure, and they basically cover the base substrate of the OLED array substrate. The electron transport layers of the light-emitting function layers of all pixels are also in an integral structure, and they basically cover the base substrate of the OLED array substrate as a whole. The electron injection layers of the light-emitting function layers of all pixels are also in an integral structure, and they basically cover the base substrate of the OLED array substrate as a whole. The light-emitting layers of the light-emitting function layers of respective pixels are spaced apart from one another, and are respectively located in respective pixel areas, for example, are respectively located in openings in pixel defining layer. In the present disclosure, a part of the light-emitting function layer of a single pixel located in the single pixel area is referred to as the effective light-emitting layer to distinguish it from the light-emitting function layer that basically covers the base substrate in the OLED display panel.

Referring to FIG. 1 and FIG. 2, in a pixel structure arranged in a GGRB arrangement, taking the red pixel area as an example, a wiring layer 20, a planarization layer 30, and an effective light-emitting layer 40 are sequentially arranged on the flat base substrate 10. Specifically, the wiring layer 20 is provided on the base substrate 10, the planarization layer 30 is provided on a side of the wiring layer 20 away from the base substrate 10, and covers the wiring layer 20, and the effective light-emitting layer 40 is provided on a side of the planarization layer 30 away from the base substrate 10.

The wiring layer includes a first wiring 21 and a signal line 22. The effective light-emitting layer 40 includes a left end located in an area A shown in FIGS. 1 and 2, and a right end in an area B shown in FIGS. 1 and 2. The first wiring 21 is located below the left end of the effective light-emitting layer 40, the signal line 22 is located below a central part of the effective light-emitting layer 40, and there is no wiring below the right end of the effective light-emitting layer 40. This arrangement may cause a surface of the planarization layer 30, which is disposed on the wiring layer 20, away from the base substrate 10 to be inclined. As shown in FIG. 2, a distance between the base substrate 10 and a part of the surface of the planarization layer 30 away from the base substrate 10 corresponding to the left end of the effective light-emitting layer 40 is greater than a distance between the base substrate 10 and a part of the surface of the planarization layer 30 away from the base substrate 10 corresponding to the right end of the effective light-emitting layer 40, so that there is a difference in height between the left end and the right end of the effective light-emitting layer 40, that is, the left end of the effective light-emitting layer 40 is higher while the right end thereof is lower. That is to say, the left end and the right end of the effective light-emitting layer 40 are not flush, and the distance between the base substrate 10 and the left end of the effective light-emitting layer 40 is greater than the distance between the base substrate 10 and the right end of the effective light-emitting layer 40. As a result, the effective light-emitting layer of the pixel area is inclined, thereby causing the brightness to decay too slowly on one end and resulting in redness on one end. As a result, the color difference between the two ends when the pixel area emits light is presented. When the user's viewing angle changes, the brightness, contrast and the like of the display screen will change, thereby causing the color shift.

In view of the above drawbacks, embodiments of the present disclosure provide an array substrate, which may alleviate the color shift phenomenon. Specifically, the array substrate includes: a base substrate; and a wiring layer and an effective light-emitting layer that are sequentially stacked and formed on the base substrate, wherein the wiring layer includes a first wiring and a second wiring. An orthographic projection of the first wiring on the base substrate is overlapped with an orthographic projection of the effective light-emitting layer on the base substrate to form a first overlapping area, and an orthographic projection of the second wiring on the base substrate is overlapped with the orthographic projection of the effective light-emitting layer on the base substrate to form a second overlapping area. The first overlapping area and the second overlapping area are respectively located on both sides of a central line of the orthographic projection of the effective light-emitting layer on the base substrate. By providing the second wiring, it is possible to reduce or even eliminate the inclination of the planarization layer and the effective light-emitting layer, thereby reducing or avoiding the color shift on both sides of the pixel area when the pixel area emits light. Hereinafter, the present disclosure will be described in detail with reference to the drawings and in conjunction with embodiments.

Figure 3:
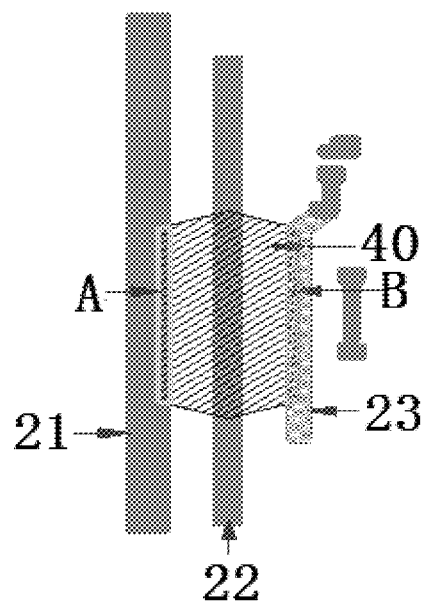
FIG. 3 is a schematic top view of a pixel area in an OLED array substrate according to some embodiments of the present disclosure.
Figure 4:
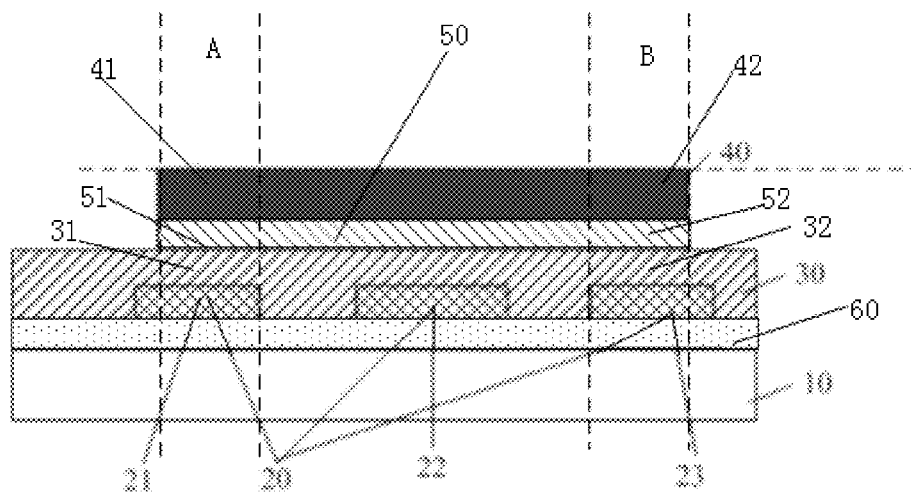
FIG. 4 is a cross-sectional view of the pixel area in the OLED array substrate in FIG. 3.

FIG. 3 and FIG. 4 are a top view and a cross-sectional view of a pixel area in an OLED array substrate provided by some embodiments of the present disclosure. Among them, FIG. 3 mainly shows a wiring layer and an effective light-emitting layer.

Referring to FIG. 3 and FIG. 4, in the pixel structure arranged in a GGRB arrangement, taking the red pixel area as an example, the OLED array substrate includes: a base substrate 10, and a wiring layer 20 and an effective light-emitting layer 40 that are sequentially stacked and formed on the base substrate 10. The wiring layer 20 includes a first wiring 21 and a second wiring 23. The base substrate 10 is, for example, a flat flexible substrate. An orthographic projection of the first wiring 21 on the base substrate 10 is overlapped with an orthographic projection of the effective light-emitting layer 40 on the base substrate 10 to form a first overlapping area, and an orthographic projection of the second wiring 23 on the base substrate 10 is overlapped with the orthographic projection of the effective light-emitting layer 40 on the base substrate 10 to form a second overlapping area. The first overlapping area and the second overlapping area are spaced apart from each other, and are respectively located on both sides of a central line of the orthographic projection of the effective light-emitting layer 40 on the base substrate 10.

In some embodiments, a distance between the base substrate 10 and a surface of the first wiring 21 facing away from the base substrate 10 is equal to a distance between the base substrate 10 and a surface of the second wiring 23 facing away from the base substrate 10, that is, the surface of the first wiring 21 facing away from the base substrate 10 and the surface of the second wiring 23 facing away from the base substrate 10 are flush (at the same height).

Referring to FIG. 3 and FIG. 4 continuously, the wiring layer 20 further includes a signal line 22, such as a data signal line, and the signal line 22 is configured to provide a data signal to the OLED in the pixel area. The first wiring 21 and the second wiring 23 are respectively disposed on both sides of the signal line 22. In some embodiments, the signal line 22, the first wiring 21 and the second wiring 23 employ the same material and are located in the same layer, and the first wiring 21, the second wiring 23 and the signal line 22 have the same height. In this way, the surface of the first wiring 21 facing away from the base substrate 10, the surface of the second wiring 23 facing away from the base substrate 10, and a surface of the signal line 22 facing away from the base substrate 10 are flush.

In some embodiments, an orthographic projection of the signal line 22 on the base substrate 10 is overlapped with the orthographic projection of the effective light-emitting layer 40 on the base substrate 10 to form a third overlapping area, and a central line of the orthographic projection of the signal line 22 on the base substrate 10 is collinear with the central line of the orthographic projection of the effective light-emitting layer 40 on the base substrate 10, that is, a central line of the third overlapping area is coincide with the central line of the orthographic projection of the effective light-emitting layer 40 on the base substrate 10.

In some embodiments, both the first overlapping area and the second overlapping area are parallel to the central line of the orthographic projection of the effective light-emitting layer 40 on the base substrate 10.

In some embodiments, the orthographic projection of the effective light-emitting layer 40 on the base substrate 10 is in an axisymmetric pattern, such as a hexagon, and the central line of the orthographic projection of the effective light-emitting layer 40 on the base substrate 10 is a symmetric axis of the axisymmetric pattern, and the first overlapping area and the second overlapping area are symmetrically arranged with respect to the central line of the orthographic projection of the effective light-emitting layer 40 on the base substrate 10.

In some embodiments, as shown in FIGS. 3 and 4, the OLED array substrate further includes a planarization layer 30, wherein the planarization layer 30 is disposed between the wiring layer 20 and the effective light-emitting layer 40. As shown in FIGS. 3 and 4, the planarization layer includes a first portion 31 and a second portion 32, the first portion 31 is located in the area A, and the second portion 32 is located in the area B. An orthographic projection of the first portion 31 on the base substrate 10 coincides with the first overlapping area, an orthographic projection of the second portion 32 on the base substrate 10 coincides with the second overlapping area, and a distance between the base substrate 10 and a surface of the first portion 31 facing away from the base substrate 10 is equal to a distance between the base substrate 10 and a surface of the second portion 32 facing away from the base substrate 10. In other words, the surface of the first portion 31 facing away from the base substrate 10 and the surface of the second portion 32 facing away from the base substrate 10 are flush.

In some embodiments, as shown in FIGS. 3 and 4, the OLED array substrate further includes a first electrode 50, for example, an anode, which is disposed between the planarization layer 30 and the effective light-emitting layer 40. The first electrode 50 includes a third portion 51 and a fourth portion 52. The third portion 51 is located in the area A, such as but limited to the left end of the first electrode 50, and the fourth portion 52 is located in the area B, such as but limited to the right end of the first electrode 50. An orthographic projection of the third portion 51 on the base substrate 10 coincides with the first overlapping area, and an orthographic projection of the fourth portion 52 on the base substrate 10 coincides with the second overlapping area. A distance between the base substrate 10 and a surface of the third portion 51 facing away from the base substrate 10 is equal to a distance between the base substrate 10 and the surface of the fourth portion 52 facing away from the base substrate 10. That is, the surface of the third portion 51 facing away from the base substrate 10 and the surface of the fourth portion 52 facing away from the base substrate 10 are flush. Also, the third portion 51 and the fourth portion 52 have the same thickness.

In some embodiments, as shown in FIGS. 3 and 4, the effective light-emitting layer 40 includes a fifth portion 41 and a sixth portion 42. The fifth portion 41 is located in the area A, such as but limited to the left end of the effective light-emitting layer 40, and the sixth portion 42 is located in the area B, such as but limited to the right end of the effective light-emitting layer 40. An orthographic projection of the fifth portion 41 on the base substrate 10 coincides with the first overlapping area, an orthographic projection of the sixth portion 42 on the base substrate 10 coincides with the second overlapping area, and a distance between the base substrate 10 and a surface of the fifth portion 41 facing away from the base substrate 10 is equal to a distance between the base substrate 10 and a surface of the sixth portion 42 facing away from the base substrate 10. That is, the surface of the fifth portion 41 facing away from the base substrate 10 and the surface of the sixth portion 42 facing away from the base substrate 10 are flush. Also, the fifth portion 41 and the sixth portion 42 have the same thickness.

Compared with the related art, in the above-mentioned embodiments of the present disclosure, the second wiring 23 is added, so that the layers in the area A, such as the planarization layer, the first electrode, the effective light-emitting layer, etc., are respectively flush with the corresponding film layers in the area B. In this way, when the pixel area emits light, the brightness is attenuated uniformly on both sides, thereby alleviating the color shift. Specifically, the surface of the planarization layer 30 facing away from the base substrate 10 is substantially parallel to the base substrate 10, for example, it is in a horizontal state. Correspondingly, both the surface of the first electrode 50 facing away from the base substrate 10 and the surface of the effective light-emitting layer 40 facing away from the base substrate 10 are substantially parallel to the base substrate 10, so as to avoid the color difference between the two sides when the pixel region emits light.

In some embodiments, the first wiring 21 is, for example, a high-voltage power supply (VDD) wiring for transmitting a VDD signal.

In some embodiments, the second wiring 23 may be connected to an initialization voltage (Vinit) signal. In this way, the second wiring 23 may be connected to a stable voltage signal without affecting a normal operation of the thin film transistor that provides signals to the OLED in the pixel area.

In some embodiments, the OLED array substrate further includes an interlayer dielectric (ILD) 60 between the base substrate 10 and the wiring layer 20, and the first wiring 21 and the second wiring 23 are formed on a side of the interlayer dielectric layer 60 facing away from a flexible backplate.

The array substrate provided by the embodiments of the present disclosure includes: the base substrate; and the wiring layer and the effective light-emitting layer that are sequentially stacked and formed on the base substrate, wherein the wiring layer includes the first wiring and the second wiring. The orthographic projection of the first wiring on the base substrate is overlapped with the orthographic projection of the effective light-emitting layer on the base substrate to form the first overlapping area, and the orthographic projection of the second wiring on the base substrate is overlapped with the orthographic projection of the effective light-emitting layer on the base substrate to form the second overlapping area. The first overlapping area and the second overlapping area are respectively located on both sides of the central line of the orthographic projection of the effective light-emitting layer on the base substrate. Compared with the related art, by providing the second wiring, it is possible to reduce or even eliminate the inclination of the planarization layer and the effective light-emitting layer, so that the brightness is attenuated uniformly on both sides when the pixel area emits light, thereby alleviating the color shift.

Figure 5:
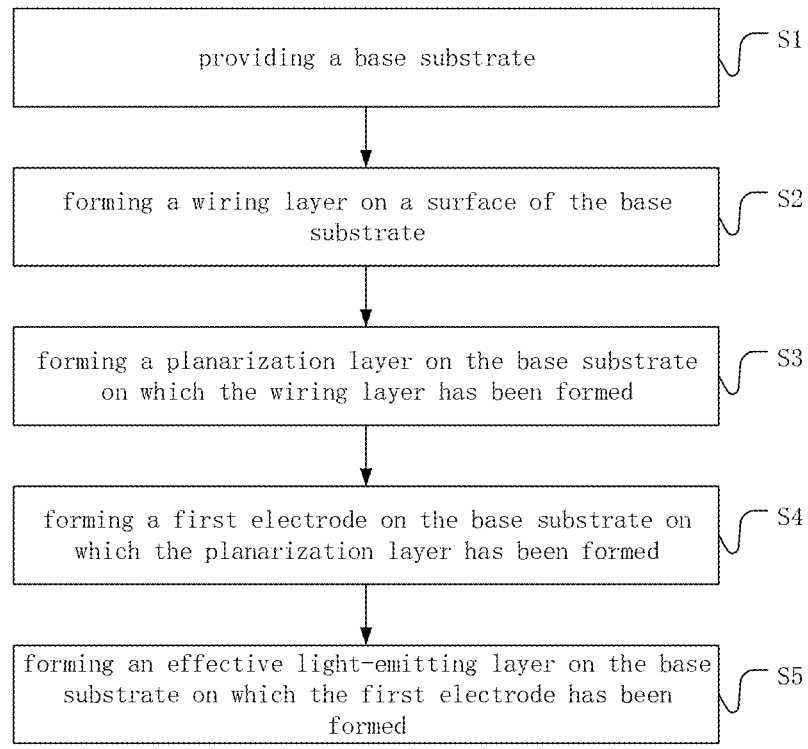
FIG. 5 is a flowchart of a manufacturing method of an OLED array substrate according to some embodiments of the present disclosure.

FIG. 5 is a flow chart of a manufacturing method of the OLED array substrate provided in the foregoing embodiments of the present disclosure. The exemplary method will be described below in conjunction with the accompanying drawings.

In step S1, a base substrate is provided. The base substrate is, for example, a flat flexible substrate.

In step S2, a wiring layer is formed on a surface of the base substrate, the wiring layer including a first wiring and a second wiring.

Specifically, a metal layer is firstly deposited on the surface of the base substrate, and then a photoresist is coated onto a surface of the metal layer facing away from the base substrate, and the photoresist is exposed and developed through a preset mask, then the metal layer is etched to form the first wiring such as a high-voltage power supply wiring, and a second wiring.

In step S3, a planarization layer is formed on the base substrate on which the wiring layer has been formed;

Specifically, a coating process is used to form the planarization layer on an entire upper surface of the base substrate on which the wiring layer has been formed. Due to the addition of the second wiring, the planarization layer is disposed on a side of the wiring layer away from the base substrate, and a surface of the planarization layer away from the base substrate is substantially parallel to the base substrate.

In step S4, a first electrode is formed on the base substrate on which the planarization layer has been formed.

Specifically, the first electrode, such as the anode, is formed through a patterning process, such as deposition, photoresist coating, exposure, development, etching, and stripping processes. The anode is disposed on a flat surface of the planarization layer away from the base substrate, so that the surface of the planarization layer away from the base substrate is substantially parallel to the base substrate.

In step S5, an effective light-emitting layer is formed on the base substrate on which the first electrode has been formed.

The effective light-emitting layer is formed by an evaporation process, and the effective light-emitting layer is arranged on the flat surface of the planarization layer away from the base substrate. Therefore, the brightness of the pixel area is attenuated uniformly on both sides when the pixel area emits light, thereby alleviating the color shift.

Based on the same inventive concept, embodiments of the present disclosure also provide a display panel, including the array substrate according to any of the above-mentioned embodiments, and the array substrate may be manufactured according to the above-mentioned manufacturing method of the array substrate. The other indispensable components of the display panel are understood by those of ordinary skill in the art, and will not be repeated here.

Based on the same inventive concept, embodiments of the present disclosure also provide a display device including the above-mentioned display panel, and the display device may include the display substrate in the foregoing embodiments. The display device may be any product or component that has a display function and a camera function, such as a TV, a monitor, a digital photo frame, a mobile phone, a smart watch, and a tablet computer.

The other indispensable components of the display panel are understood by those of ordinary skill in the art, and will not be repeated here.

Figure 6:
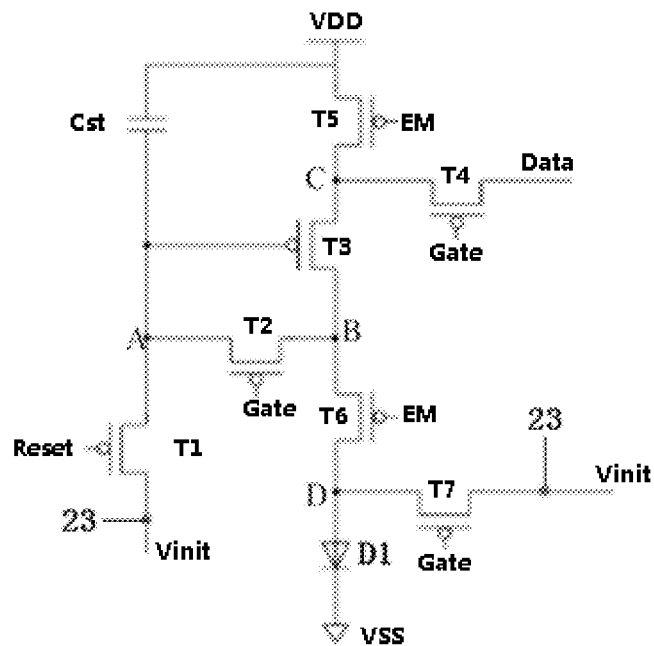
FIG. 6 is a schematic view of a pixel driving circuit corresponding to the pixel area in the OLED array substrate according to some embodiments of the present disclosure.

FIG. 6 is a schematic view of a pixel driving circuit in a pixel area of an OLED array substrate according to some embodiments of the present disclosure, wherein the pixel driving circuit includes: a first thin film transistor T1, a second thin film transistor T2, a third thin film transistor T3, a fourth thin film transistor T4, a fifth thin film transistor T5, a sixth thin film transistor T6, a seventh thin film transistor T7, a capacitor C1, an organic light-emitting diode D1 (i.e., OLED device).

A source electrode of the first thin film transistor T1 is connected to an initialization signal Vinit, a gate electrode is electrically connected to a reset signal Reset, and a drain electrode is electrically connected to a first node A.

A gate electrode of the second thin film transistor T2 is connected to a scan signal Gate, a source electrode is electrically connected to a second node B, and a drain electrode is electrically connected to the first node A.

A source electrode of the third thin film transistor T3 is electrically connected to the second node B, a gate electrode is electrically connected to the first node A, and a drain electrode is electrically connected to a third node C.

A gate electrode of the fourth thin film transistor T4 is connected to the scan signal Gate, a source electrode is electrically connected to a data signal Data, and a drain electrode is electrically connected to the third node C.

A source electrode of the fifth thin film transistor T5 is connected to a first power supply voltage, such as the high-voltage power VDD, a gate electrode is connected to a light-emitting control signal EM, and a drain electrode is electrically connected to the third node C.

A source electrode of the sixth thin film transistor T6 is electrically connected to the second node B, a gate electrode is connected to the emission control signal EM, and a drain electrode is electrically connected to a fourth node D.

A source electrode of the seventh thin film transistor T7 is electrically connected to the initialization signal Vinit, and a drain electrode is electrically connected to the fourth node D.

An anode of the organic light-emitting diode D1 is connected to the fourth node, and a cathode is connected to a second power supply voltage, such as a low-voltage power VSS.

Both ends of the capacitor C1 are electrically connected to the first node and the first power supply voltage, such as the high-voltage power VDD.

In some embodiments, as shown in FIG. 6, the second wiring 23 is connected to the initialization signal, that is, the Vinit signal. In other words, the second wiring 23 may be electrically connected to the source electrode of the first thin film transistor T1 and the source electrode of the seventh thin film transistor T7.

In some embodiments, the second wiring 23 may also be electrically connected to the first node A.

In some embodiments, the second wiring 23 may be floating, that is, the second wiring 23 is a dummy electrode.

The above description is only preferred embodiments of the present disclosure and an explanation of the applied technical principles. Those skilled in the art should understand that the scope of the invention involved in the present disclosure is not limited to the technical solutions formed by the specific combination of the above technical features, and should also cover other technical solutions which are formed by any combination of the above features and their equivalent features without departing from the inventive concept, for example, technical solutions which are formed by replacing the above features with features having the similar functions as the features disclosed (but not limited to) in the present disclosure.

What is claimed is:

1. An array substrate, comprising:
   a base substrate;
   a wiring layer and an effective light-emitting layer formed and stacked on the base substrate sequentially;
   a planarization layer between the wiring layer and the effective light-emitting layer; and
   an interlayer dielectric layer between the base substrate and the wiring layer,
   wherein the wiring layer comprises a first wiring and a second wiring, the first wiring and the second wiring are formed on a surface of the interlayer dielectric layer facing away from the base substrate, the second wiring is floating or is connected to an initialization voltage signal, an orthographic projection of the first wiring on the base substrate is overlapped with an orthographic projection of the effective light-emitting layer on the base substrate to form a first overlapping area, an orthographic projection of the second wiring on the base substrate is overlapped with the orthographic projection of the effective light-emitting layer on the base substrate to form a second overlapping area, the orthographic projection of the second wiring on the base substrate is partially overlapped with the second overlapping area, and the first overlapping area and the second overlapping area are respectively located on both sides of a central line of the orthographic projection of the effective light-emitting layer on the base substrate, and wherein a surface of the planarization layer facing away from the base substrate is in a horizontal state and is substantially parallel to the base substrate.

2. The array substrate according to claim 1, wherein a distance between the base substrate and a surface of the first wiring facing away from the base substrate is equal to a distance between the base substrate and a surface of the second wiring facing away from the base substrate.

3. The array substrate according to claim 1, wherein the orthographic projection of the effective light-emitting layer on the base substrate is in an axisymmetric pattern, and the central line of the orthographic projection of the effective light-emitting layer on the base substrate is a symmetry axis of the axisymmetric pattern.

4. The array substrate according to claim 3, wherein the first overlapping area and the second overlapping area are symmetrically arranged with respect to the central line of the orthographic projection of the effective light-emitting layer on the base substrate.

5. The array substrate according to claim 4, wherein the first overlapping area and the second overlapping area are both parallel to the central line of the orthographic projection of the effective light-emitting layer on the base substrate.

6. The array substrate according to claim 1, wherein the wiring layer further comprises a signal line, wherein a central line of an orthographic projection of the signal line on the base substrate and the central line of the orthographic projection of the effective light-emitting layer on the base substrate are collinear.

7. The array substrate according to claim 6, wherein the first wiring, the second wiring and the signal line are arranged in the same layer and employ the same material, and the first wiring, the second wiring and the signal line have the same thickness.

8. The array substrate according to claim 7, wherein the first wiring is a high-voltage power wiring, and the signal line is a data signal line.

9. The array substrate according to claim 1, wherein the planarization layer comprises a first portion and a second portion, an orthographic projection of the first portion on the base substrate coincides with the first overlapping area, an orthographic projection of the second portion on the base substrate coincides with the second overlapping area, and a distance between the base substrate and a surface of the first portion facing away from the base substrate is equal to a distance between the base substrate and a surface of the second portion facing away from the base substrate.

10. The array substrate according to claim 9, further comprising:

a first electrode between the planarization layer and the effective light-emitting layer, wherein the first electrode comprises a third portion and a fourth portion, an orthographic projection of the third portion on the base substrate coincides with the first overlapping area, an orthographic projection of the fourth portion on the base substrate coincides with the second overlapping area, a distance between the base substrate and a surface of the third portion facing away from the base substrate is equal to a distance between the base substrate and a surface of the fourth portion facing away from the base substrate, and the third portion and the fourth portion have the same thickness.

11. The array substrate according to claim 10, wherein the effective light-emitting layer comprises a fifth portion and a sixth portion, an orthographic projection of the fifth portion on the base substrate coincides with the first overlapping area, an orthographic projection of the sixth portion on the base substrate coincides with the second overlapping area, a distance between the base substrate and a surface of the fifth portion facing away from the base substrate is equal to a distance between the base substrate and a surface of the sixth portion facing away from the base substrate, and the fifth portion and the sixth portion have the same thickness.

12. The array substrate according to claim 11, wherein the fifth portion and the sixth portion are respectively located at two opposite edge regions of the effective light-emitting layer.

13. A display panel comprising the array substrate according to claim 1.

14. A display device comprising the display panel according to claim 13.

15. A pixel driving circuit applied to the array substrate according to claim 1, comprising a first thin film transistor, a second thin film transistor, a third thin film transistor, a fourth thin film transistor, a fifth thin film transistor, a sixth thin film transistor, a seventh thin film transistor, a capacitor, and an organic light-emitting diode, wherein:

a source electrode of the first thin film transistor is connected to an initialization signal, a gate electrode of the first thin film transistor is electrically connected to a reset signal, and a drain electrode of the first thin film transistor is electrically connected to a first node;

a gate electrode of the second thin film transistor is connected to a scan signal, a source electrode of the second thin film transistor is electrically connected to a second node, and a drain electrode of the second thin film transistor is electrically connected to the first node;

a source electrode of the third thin film transistor is electrically connected to the second node, a gate electrode of the third thin film transistor is electrically connected to the first node, and a drain electrode of the third thin film transistor is electrically connected to a third node;

a gate electrode of the fourth thin film transistor is connected to the scan signal, a source electrode of the fourth thin film transistor is electrically connected to a data signal, and a drain electrode of the fourth thin film transistor is electrically connected to the third node;

a source electrode of the fifth thin film transistor is connected to a first power voltage, a gate electrode of the fifth thin film transistor is connected to a light-emitting control signal, and a drain electrode of the fifth thin film transistor is electrically connected to the third node;

a source electrode of the sixth thin film transistor is electrically connected to the second node, a gate electrode of the sixth thin film transistor is connected to a light-emitting control signal, and a drain electrode of the sixth thin film transistor is electrically connected to a fourth node;

a gate electrode of the seventh thin film transistor is connected to the scan signal, a source electrode of the seventh thin film transistor is electrically connected to the initialization signal, and a drain electrode of the seventh thin film transistor is electrically connected to the fourth node;

a first electrode of the organic light-emitting diode is connected to the fourth node, and a second electrode of the organic light-emitting diode is connected to a second power supply voltage;

both ends of the capacitor are electrically connected to the first node and the first power supply voltage, respectively.

16. A manufacturing method of an array substrate, wherein the array substrate comprises:

a base substrate;

a wiring layer and an effective light-emitting layer formed and stacked on the base substrate sequentially;

a planarization layer between the wiring layer and the effective light-emitting layer; and an interlayer dielectric layer between the base substrate and the wiring layer, wherein the wiring layer comprises a first wiring and a second wiring, the first wiring and the second wiring are formed on a surface of the interlayer dielectric layer facing away from the base substrate, the second wiring is floating or is connected to an initialization voltage signal, an orthographic projection of the first wiring on the base substrate is overlapped with an orthographic projection of the effective light-emitting layer on the base substrate to form a first overlapping area, an orthographic projection of the second wiring on the base substrate is overlapped with the orthographic projection of the effective light-emitting layer on the base substrate to form a second overlapping area, the orthographic projection of the second wiring on the base substrate is partially overlapped with the second overlapping area, and the first overlapping area and the second overlapping area are respectively located on both sides of a central line of the orthographic projection of the effective light-emitting layer on the base substrate, and wherein a surface of the planarization layer facing away from the base substrate is in a horizontal state and is substantially parallel to the base substrate, and the method comprises:

providing the base substrate;

forming the wiring layer on the base substrate, the wiring layer comprising the first wiring and the second wiring; and forming the effective light-emitting layer on the base substrate on which the wiring layer has been formed.

17. The manufacturing method according to claim 16, wherein, before forming the effective light-emitting layer, the manufacturing method further comprises:

forming the planarization layer on the base substrate on which the wiring layer has been formed, wherein the planarization layer comprises a first portion and a second portion, an orthographic projection of the first portion on the base substrate coincides with the first overlapping area, an orthographic projection of the second portion on the base substrate coincides with the second overlapping area, and a distance between the base substrate and a surface of the first portion facing away from the base substrate is equal to a distance between the base substrate and a surface of the second portion facing away from the base substrate.

18. The manufacturing method according to claim 17, wherein, before forming the effective light-emitting layer, the manufacturing method further comprises:

forming the first electrode on the base substrate on which the planarization layer has been formed, wherein the first electrode comprises a third portion and a fourth portion, an orthographic projection of the third portion on the base substrate coincides with the first overlapping area, an orthographic projection of the fourth portion on the base substrate coincides with the second overlapping area, a distance between the base substrate and a surface of the third portion facing away from the base substrate is equal to a distance between the base substrate and a surface of the fourth portion facing away from the base substrate, and the third portion and the fourth portion have the same thickness.

* * * * *

UNITED STATES PATENT AND TRADEMARK OFFICE
CERTIFICATE OF CORRECTION

| | |
|---|---|
| PATENT NO. | : 11,563,073 B2 |
| APPLICATION NO. | : 17/040587 |
| DATED | : January 24, 2023 |
| INVENTOR(S) | : Meng Li et al. |

It is certified that error appears in the above-identified patent and that said Letters Patent is hereby corrected as shown below:

On the Title Page

Under Item (71), Lines 6-9, please delete "BOE Technology Group Co., Ltd., Beijing (CN); Chengdu BOE Optoelectronics Technology Co., Ltd., Chengdu (CN)" and insert --Chengdu BOE Optoelectronics Technology Co., Ltd., Chengdu (CN); BOE Technology Group Co., Ltd., Beijing (CN)--

Under Item (73), Lines 17-21, please delete "BOE Technology Group Co., Ltd., Beijing (CN); Chengdu BOE Optoelectronics Technology Co., Ltd., Chengdu (CN)" and insert --Chengdu BOE Optoelectronics Technology Co., Ltd., Chengdu (CN); BOE Technology Group Co., Ltd., Beijing (CN)--

Signed and Sealed this
Fourth Day of April, 2023

Katherine Kelly Vidal
*Director of the United States Patent and Trademark Office*